United States Patent [19]

Sayer et al.

[11] 3,942,101

[45] Mar. 2, 1976

[54] METHOD FOR LOCATING AND EVALUATING GEOTHERMAL SOURCES OF ENERGY BY SENSING ELECTROSTATIC VOLTAGE GRADIENTS

[76] Inventors: Wayne L. Sayer, 2851 N. Inyo St., Bakersfield, Calif. 93305; Pat Wright, 6209 Hartman Ave., Bakersfield, Calif. 93309

[22] Filed: Dec. 6, 1973

[21] Appl. No.: 422,319

[52] U.S. Cl. ................... 324/1; 324/7; 324/71 R
[51] Int. Cl.². G01V 3/08; G01R 5/28; G01N 27/60
[58] Field of Search ............ 324/1, 7, 9, 71, 72, 32; 73/154

[56] References Cited
UNITED STATES PATENTS

| | | | |
|---|---|---|---|
| 2,659,863 | 11/1953 | Stanton | 324/1 |
| 2,784,370 | 3/1957 | Morrison | 324/1 X |
| 3,087,111 | 4/1963 | Lehan et al. | 324/7 X |
| 3,197,704 | 7/1965 | Simon et al. | 324/7 X |
| 3,361,957 | 1/1968 | Hings | 324/9 X |

OTHER PUBLICATIONS

Anderson et al., The Application of the Self–Potential Method in the Search for Geothermal Energy, Geophysics, Vol. 38, No. 6, Dec. 1973.

*Primary Examiner*—Gerard R. Strecker
*Attorney, Agent, or Firm*—Huebner & Worrel

[57] ABSTRACT

A method and apparatus for locating and evaluating geothermal sources of energy wherein it is known that the earth has electrical currents and that these currents are reflected in electrostatic voltage gradients above the earth with magnitudes in proportion to the magnitudes of adjacent subterranean geothermal sources, characterized by detecting the voltage gradients; individually recording the voltage gradients; and evaluating the recorded gradients for determination of the location and potential of adjacent sources of geothermal energy.

10 Claims, 3 Drawing Figures

METHOD FOR LOCATING AND EVALUATING GEOTHERMAL SOURCES OF ENERGY BY SENSING ELECTROSTATIC VOLTAGE GRADIENTS

BACKGROUND OF THE INVENTION

The present invention relates to a method and apparatus for locating and evaluating geothermal sources of energy and more particularly to such a method and apparatus which are operable at a small fraction of the expense of conventional methods and apparatus in locating geothermal sources of commercial potential with the capability of evaluating vast territories rapidly, efficiently, and with a precision not heretofore achievable at a commercially acceptable expense.

The few prior art patents, such as the Blau U.S. Pat. No. 2,403,704 and Birman U.S. Pat. No. 3,217,550, relate primarily to methods and/or apparatus requiring the drilling of exploratory boreholes to permit the recording of subsurface temperatures. Such prior art practices are subject to deficiencies which the method and apparatus of the present invention have overcome.

As pointed out in joint applicant Sayer's copending patent application, Ser. No. 325,657, filed Jan. 22, 1973, geothermal anomalies, that is subterranean sources of heat energy, have long been recognized as a potentially almost unlimited source of energy. Geothermal anomalies are often manifest in the form of subterranean bodies of naturally super heated water or steam. Whether or not ambient fluid is present at the source is not of primary importance, however, since it is known to pump surface water to such sources for heating to permit the subsequent extraction of energy from the water. Thus, it is the location of the geothermal source itself which is of paramount importance.

The approximate location of such sources is sometimes apparent in the presence on the surface of the earth of such phenomena as geysers and fumaroles. However, it is extremely difficult to locate the sources of such surface features because they are frequently connected to the surface through intricate underground passages or vents leading from the surface to the source at great depth and sometimes laterally disposed with respect to the surface phenomena. Furthermore, it has been discovered that abundant geothermal sources lie at depths in the earth in areas where there is an absence of surface features which would make their presence readily apparent.

Conventional practice requires the performance of laborious and extremely expensive surveys in order adequately to evaulate even quite limited areas. Such surveys commonly require the drilling of a plethora of trial boreholes and the recording of temperatures at the bottoms of such boreholes. This is normally inordinately expensive and frequently proves to be fruitless. Thus, the harnessing of geothermal energy has been of only limited success due to the difficulty in accurately and efficiently locating the sources of such energy at a commercially acceptable cost rather than in bringing such sources into production once located.

Therefore, it has long been recognized that it would be desirable to have a method and apparatus capable of accurately, inexpensively and dependably locating sources of geothermal energy of commercial significance.

SUMMARY OF THE INVENTION

It is therefore an object of the present invention to provide an improved method and apparatus for locating geothermal sources of energy.

Another object is to provide such a method and apparatus which have the capability of making available vast natural reserves of energy for the generation of electrical energy therefrom.

Another object is to provide such a method and apparatus which make commercially feasible the harnessing of abundant sources of geothermal energy not heretofore available because of the conventionally inordinate expense of locating them.

Another object is to provide such a method and apparatus which permit a thorough and dependable evaluation of the geothermal potential of expansive areas of terrain.

Another object is to provide such a method and apparatus which vastly increase the speed with which geothermal sources can be located and evaluated.

Another object is to provide such a method and apparatus which do not require the repeated drilling of exploratory bore-holes in an attempt to locate sources of geothermal energy.

Another object is to provide such a method and apparatus which do not require an elaborate array of test equipment.

Another object is to provide such a method and apparatus which utilize a geological phenomenon to gather the test data for evaluation.

Another object is to provide such a method and apparatus which are adapted to be utilized in even quite rugged terrain.

A further object is to provide such a method and apparatus which can be selectively and discriminately employed to locate geothermal sources with a precision not heretofore achievable.

Further objects and advantages are to provide improved elements and arrangements thereof in an apparatus for the purposes described which is dependable, economical, durable and fully effective in accomplishing its intended purposes.

DESCRIPTION OF THE PREFERRED EMBODIMENT

Figures 1, 2, 3:
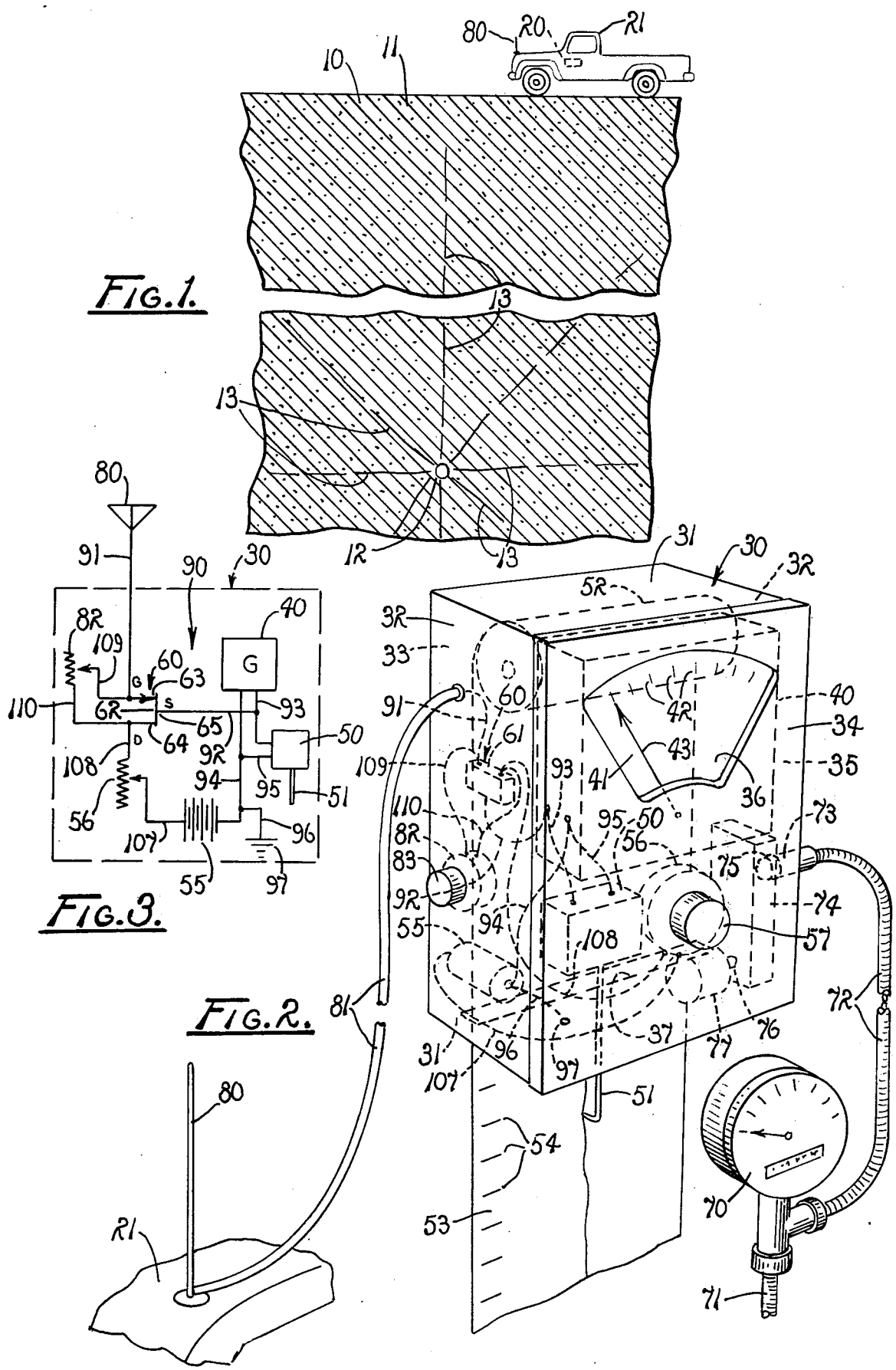
FIG. 1 is a schematic side elevation of the apparatus of the present invention shown mounted in its operative environment on a vehicle on the earth's surface relative to a representative subterranean geothermal source.
FIG. 2 is a perspective view of the apparatus of the present invention.
FIG. 3 is a schematic diagram of the apparatus showing the electrical circuit thereof.

It is not known with certainty what natural phenomenon is responsible for the operative success of the method and apparatus of the present invention. However, it is believed, as a result of experimentation, that a phenomenon known as the Nernst Effect occurring spontaneously in nature makes possible the operation of the method and apparatus of the present invention. In essence, the Nernst Effect acknowledges that a heat flux, incident on a slab of material which is subjected to a magnetic field, applied perpendicular to the heat flux produces a voltage gradient which is transverse to both the heat flux and the magnetic field. It is believed by the applicants that the Nernst Effect occurs spontaneously in nature in a heretofore unknown manner having a relationship to geothermal sources of energy of monumental importance. It is believed that a given geothermal heat flux eminating vertically through the earth to the surface subjected to the earth's natural magnetic field produces a voltage gradient of a given magnitude in the earth and that this gradient is reflected in an electrostatic voltage gradient of equal magnitude above the earth's surface.

Although it is not known with certainty that the Nernst Effect accounts for this phenomenon of voltage gradients, it is known that such voltage gradients exist. More importantly, it has been discovered by the applicants that there exists a relationship between such voltage gradients above the earth's surface and the heat flux of adjacent geothermal sources. Certain reliable and consistent characteristics of these voltage gradients have given rise to the method and apparatus of the present invention. The applicants have discovered that the magnitudes of the individual voltage gradients correspond directly or are in proportion to the magnitudes of the heat flux from geothermal sources lying substantially vertically below the points of location of the voltage gradients on the earth's surface. The method and apparatus of the present invention are intended to operate on this relationship to permit the location and evaluation of geothermal sources of commercial potential.

Referring more particularly to the drawing, the phenomenon discovered by the applicants is schematically represented in FIG. 1. The earth's crust is represented at 10 below the earth's surface 11. The earth's crust, for illustrative convenience, is shown in the drawing as a homogeneous composition. Although, of course, such subsurface features as rock strata, ground water, sand, oil deposits, and the like may be present, such features are not believed significantly to affect the operation of the method and apparatus of the present invention.

A source of geothermal energy is schematically represented at 12 in the earth's crust 10 lying at depth below the earth's surface 11. For illustrative convenience, radiant heat energy or heat flux from the source is shown by lines 13. As previously noted, this heat flux, when subjected to the earth's natural magnetic field, is believed to produce a voltage gradient, not shown, in the earth which is reflected in an electrostatic voltage gradient, also not shown, above the earth's surface of equal magnitude. However, regardless of the cause for this phenomenon, the electrostatic voltage gradients above the earth's surface have been found to vary directly with or in proportion to the magnitude of the geothermal source. These voltage gradients are quite small varying through a range normally of from very small fractions of volts to 3.0 volts or greater.

In essence, the practice of the method of the present invention calls for the sensing or detecting of such electrostatic voltage gradients above the earth's surface 11 during earth traversing movement through an area selected to be studied, the recording of the voltage gradients noting the relative location on the earth's surface in the test area of such detection and the subsequent evaluating of the recorded gradients preferably by geographically plotting the readings on a map at the points recorded to locate the geothermal source of the greatest commercial potential. It is believed that movement over the earth's surface is required in the practice of the method although the reason for this is not known with certainty. It is suspected that an "in place" reading is interfered with by air static voltages.

The apparatus of the present invention is generally represented at 20 in FIG. 1 shown mounted on a suitable vehicle 21 adapted for earth traversing movement. As will become more clearly apparent, the apparatus can be mounted on a variety of types of vehicles.

The apparatus 20 has a box-like housing 30, having integral opposite end walls 31 and opposite side walls 32. The housing has a back plate 33 and a face plate 34 mounted on the end and side walls in spaced, substantially parallel relation so as to form an interior 35 for the housing. The face plate has a display window therein. The lower end wall, as viewed in FIG. 2, has an elongated longitudinal slot 37 therein for purposes subsequently to be described.

A galvanometer 40 is mounted on the face plate 34 in the interior 35 of the housing 30. The galvanometer has a dial 41 which displays a scale of indicia 42. The galvanometer preferably has a range of sensitivity, represented by the scale of indicia on the dial, of from 0 volts to more than 3.0 volts. The galvanometer is mounted on the face plate with the dial in alignment with the display window of the plate. An indicator needle 43 is operably borne by the galvanometer in the conventional fashion to indicate a voltage reading against the indicia within the display window.

A strip chart recorder 50, capable of recording the amplitude variations of the electrostatic voltage gradients is mounted in the interior 35 of the housing 30 adjacent to the slot 37. The recorder has a recording sweep hand 51 extending through the slot, as shown in FIG. 2. The sweep hand is of any suitable type capable of recording the data received by the recorder on a strip chart. A continuous strip chart 52 is mounted in the interior of the housing in a rolled configuration. The strip chart is mounted so as to be capable of being gradually unrolled. The strip chart has a lead portion 53 which is extended through the slot 37 so as to be engaged by the sweep hand, as shown in FIG. 2. The strip chart can be constructed of any suitable material including paper or transparent plastic. In any case, the strip chart preferably displays indicia or calibrations 54 adjacent to one edge thereof throughout the length of the chart to indicate geographic location, as will subsequently be described. A power source or battery 55 is removably mounted in the interior of the housing for convenient replacement. A potentiometer 56 is provided on the face plate 34 of the housing within the interior 35. The potentiometer mounts a control dial assembly 57 extending through the face plate to the exterior of the housing for manual adjustment.

A field-effect transistor 60 is affixed in the interior 35 of the housing 30 on a side wall 32. The transistor has a case 61 having a standard field-effect transistor wafer or plate 62 mounted therein. As best shown schematically in FIG. 3, the transistor plate has a gate contact 63, a drain contact 64, and a source contact 65.

The vehicle 21 has an odometer 70, shown in FIG. 2. The odometer is of conventional design mounted in driven engagement with an odometer drive cable assembly 71 of the vehicle. A strip chart drive cable assembly 72 is mounted in driven engagement with the odometer drive cable assembly. The assembly 72 has a remote drive take-off connection 73. A transmission mechanism 74 is borne by a side wall 32 of the housing 30. The mechanism has a connection socket 75 adapted to receive the take-off connection in driving engagement with the transmission mechanism. The transmission mechanism mounts a drive shaft 76 in driven relation thereto extending into the interior 35 of the housing. A friction drive wheel 77 is fastened on the drive shaft in the interior of the housing. The wheel is retained by the shaft in driving engagement with the lead portion 53 of the strip chart 52. As will subsequently be made more clearly apparent, when the connection is inserted in the socket, the transmission mechanism is adapted to rotate the drive wheel 77 at a predetermined speed so that data recorded on the chart is directly opposite to indicia 54 displayed by the chart indicating the precise geographic location in the test area at which the data was recorded.

A voltage sensitive probe 80 is mounted on the vehicle preferably on the forwardmost portion thereof with respect to the intended direction of travel, as shown in FIG. 1. The optimum length and attitude of the probe depends on the environment in which the test is to be conducted, the magnitude of the voltage gradients to be detected, and the specific sensitivity characteristics of transistor 60. The probe is connected with the housing 30 of the apparatus 20 by an insulated probe cable 81 extending therebetween. An adjustable or variable resistor 82 is affixed on a side wall 32 of the housing within the interior 35 thereof. The resistor mounts a control dial assembly 83 extending through the side wall of the housing 30, as shown in FIG. 2. The resistor is of the variable high-ohmage, grid-leak type. The resistor has at least a 100 megaohms range and is preferred to have a 200 megaohm range.

Keeping in mind that the signals which are to be detected by the apparatus 20 are of an extremely low voltage thereby requiring an apparatus of extreme sensitivity, the wiring of the apparatus to ensure such sensitivity while precluding the possibility of signal overload is of paramount importance. An electrical circuit 90 for the apparatus is schematically shown in FIG. 3. The circuit has a first electrical conductor 91 operably extended from the probe 80 through the insulated probe cable 81 into the case 61 and connected, as by welding, to the gate contact 63 of the field-effect transistor 60. A second electrical conductor 92 is secured, as by welding, to the source contact 65 of the transistor. A third electrical conductor 93 is connected, intermediate its opposite ends, to the remote end of the second electrical conductor with its opposite ends individually operably connected to the galvanometer 40 and the strip chart recorder 50. A fourth electrical conductor 94 operably interconnects the galvanometer and the battery 55. A fifth electrical conductor 95 interconnects the strip chart recorder and the fourth electrical conductor 94 so that the galvanometer and the strip chart recorder are electrically connected in parallel to the electrical circuit. A sixth electrical conductor 96 is connected to conductor 94 and attached at its remote end to ground contact 97 on an end wall 31 of the housing 30. The apparatus 20 is adapted to be grounded to the vehicle 21 by the connection to the ground contact of a ground wire, not shown, connected to the frame of the vehicle.

A seventh electrical conductor 107 electrically interconnects the battery 55 and the potentiometer 56. An eighth electrical conductor 108 operably extends from the potentiometer through the case 61 and is connected at its remote end, as by welding, to the drain contact 64 of the field-effect transistor 60. A ninth electrical conductor 109 operably interconnects the first electrical conductor 91 and the resistor 82. A tenth electrical conductor 110 interconnects the resistor and the eighth electrical conductor 108.

The electrical circuit 90 thus connects in series the probe 80, the transistor 60 which is in parallel with the resistor 82, the galvanometer 40 which is in parallel with the strip chart recorder 50, the battery 55, and the potentiometer 56. The resistor 82, it will be noted, is connected as a parallel bypass to the transistor. Wired in this configuration, the transistor operates as a voltage detector for extremely low voltage gradients, that is, within the range of from 0 volts to approximately 3.0 volts. Experimentation has shown that the apparatus 20 is capable of detecting even such extremely low voltage gradients as those of the static electricity produced by a body moving through ambient air. Because of this extreme sensitivity, it has been found beneficial to utilize a variable resistor of the type described to prevent momentary signal overloading of the transistor when voltages in its upper range are detected.

Use of the apparatus 20 in the practice of the method described is accomplished expeditiously and, through the detecting and recording stages, virtually automatically. Initially an area to be surveyed is selected. The indicia on the lead portion 53 of the strip chart is noted and correlated with a preselected path to be traveled through the area to be surveyed. In this way, the precise location in the survey area of subsequent recordings can be determined. The apparatus 20 is activated by switching on the potentiometer 56, using the dial assembly 57, to allow electrical energy to flow from the battery 55 through the electrical circuit 90 to the potentiometer, transistor 60, galvanometer 40, and strip chart recorder 50. Drive for the strip chart 52 is provided by insertion of the take-off connection 73 of the drive cable assembly 72 into the connection socket 75 of the transmission mechanism 74.

Experimentation and the strength of the electrostatic voltage gradients in the area to be surveyed govern the appropriate setting for the potentiometer 56 using the dial assembly 57. Similarly, the appropriate setting for the variable resistor 82, using the control dial 83 thereof, is determined by the strength of the electrostatic voltage gradients in the area. The setting should be sufficient to preclude even momentary signal overload of the transistor 60.

The vehicle 21 on which the apparatus 20 is mounted, as described, is subsequently driven through the area to be surveyed following the selected path of travel. Although the ground speed of the vehicle is not of critical importance, it has been found that the optimum ground speed for the vehicle is approximately 40 miles per hour for one embodiment of the invention. The probe 80, as previously discussed, is mounted on the forwardmost portion of the vehicle 21 with respect to the direction of travel. This prevents signal interference by any static electricity produced by movement of the vehicle through the air.

As the vehicle travels through the area to be surveyed, the electrostatic voltage gradients above the earth's surface 11 are picked up by the probe 80 and the signal is transmitted along the first electrical conductor 91 of the electrical circuit 90 to the field-effect transistor 60. Of course, depending upon the particular setting of the resistor 82, a portion of the signal is diverted through the resistor to avoid overloading of the transistor, as described. The signal is detected by the transistor and transmitted from the source contact 65 through the electrical conductors 92 and 93 to the galvanometer 40 and strip chart recorder 50.

Completion of the electrical circuit 90 through the battery 55 drives the galvanometer 40 and strip chart recorder 50 to register the specific voltage of the gradient detected by the transistor 60. In the conventional fashion, the voltage is registered by the galvanometer by movement of the indicator needle 43 against the scale of indicia 42 as viewed through the display window 36 of the galvanometer. This gives the operator immediate voltage readings facilitating selected adjustment of the potentiometer 56 and resistor 82 for readings of optimum value. Similarly, the recorder operates in the conventional fashion to motivate the sweep hand 51 thereof to record the voltage of the detected signal on the strip chart 52. As previously noted, the friction drive wheel 77 draws the strip chart from its rolled configuration, shown in FIG. 2, at a rate of speed correlated with the speed of the vehicle 21. The transmission mechanism 74 converts the drive supplied thereto from the odometer 70 by way of the drive cable assemblies 71 and 72 to drive the strip chart at the predetermined rate of speed so that recording of voltage of the signal on the strip chart is directly opposite the indicia 54 thereon indicating the precise location in the area surveyed of the recorded signal.

Practice of the method of the present invention utilizing the apparatus 20 calls for traversing the area to be surveyed along the selected path. Preferably, the earth's surface 11 is traversed in reciprocal substantially parallel paths along the earth's magnetic lines of force. Of course, the more thoroughly the area is traversed, the more precision will be afforded the survey. However, continued practice of the method with the apparatus will indicate what amount of recorded data will be sufficient to permit a reliable evaluation of a given area surveyed.

Subsequent to the gathering of the data as above described, the strip charts 52 bearing the recorded information thereon are employed geographically to plot the recorded readings on a field map of the test area along routes representing the paths traveled. Once this information is plotted on the map, the map is evaluated, preferably by a geologist skilled in the location of geothermal sources. In essence, the evaluation requires only a recognition of those portions of the area surveyed wherein the highest voltage gradients detected were recorded. Since, as previously noted, the magnitudes of such voltage gradients are in proportion to the magnitudes of the geothermal sources 20 in the area, this process is easily accomplished. Other factors to be considered, however, in deciding on the commercial potential of the site are geology, accessibility, and the like. If after such analysis it appears that the test data indicates the site of a geothermal source of commercial potential, the conventional procedures for reaching and harnessing the source are subsequently initiated. These may include the conducting of more extensive tests at the site and the drilling of initial boreholes.

Therefore, it can be seen that the method and apparatus of the present invention permit the accurate and reliable evaluation of virtually any given area to be surveyed for the location of geothermal sources of commercial potential at a commercially acceptable and comparatively minimal expense.

Although the invention has been herein shown and described in what is conceived to be the most practical and preferred embodiment, it is recognized that departures may be made therefrom within the scope of the invention, which is not to be limited to the illustrative details disclosed.

Having described our invention, what we claim as new and desire to secure by letters patent is:

1. A method of locating subterranean sources of geothermal energy wherein electrostatic voltage gradients are present at the earth's surface which correspond to the heat emanating from said geothermal sources, comprising traversing an area on the surface of the earth to be examined for geothermal sources, during such traversal sensing the magnitudes of the electrostatic voltage gradients traversed, comparing the magnitudes of the electrostatic voltage gradients sensed to determine those of the greatest magnitude, and locating a source of geothermal energy by determining the positions of the voltage gradients of the greatest magnitude in the area traversed.

2. The method of claim 1 wherein the step of sensing is conducted at a substantially uniform elevation adjacent to the earth traversed.

3. The method of claim 1 wherein the sensing is performed at a single mobile point transported in said earth traversing movement.

4. The method of claim 1 including recording the magnitudes of the voltage gradients sensed on a chart representative of the area traversed.

5. The method of claim 4 including comparing the voltage gradients recorded on the chart with the geographical locations in the area traversed to determine the contours of said geothermal sources.

6. The method of claim 1 wherein the step of traversing the surface of the earth is performed along reciprocal substantially parallel paths.

7. The method of claim 6 wherein said paths are substantially along the earth's natural magnetic lines of force so that voltage gradients sensed during earth traversing movement are those produced transversely of said lines of force.

8. A method, of locating and evaluating sources of geothermal energy which have electrical self potentials which produce electrostatic voltage gradients above the earth's surface corresponding in magnitude to the energy levels of the geothermal sources, comprising traversing the earth's surface in an area to be prospected for subterranean geothermal sources; detecting the electrostatic voltage gradients encountered during such traversing of the earth's surface; recording the magnitudes of the voltage gradients detected; recording the relative geographical locations of the voltage gradients detected; plotting the geographical locations for the voltage gradients detected; and evaluating the magnitudes of the geothermal sources from said plotting.

9. A method of locating subterranean sources of geothermal energy comprising:

A. selecting a geographical area to be examined;
B. preparing a chart representative of the area selected;
C. traversing the selected area while recording the magnitudes of electrostatic voltage gradients of the subterranean sources in the area traversed;
D. collating the magnitudes of the electrostatic voltage gradients recorded with the corresponding positions in the geographical area represented on the chart; and
E. determining the location of said sources of geothermal energy by designating the positions in the geographical area corresponding to the electrostatic gradients of greatest magnitude.

10. A method of locating subterranean sources of geothermal energy wherein the earth's magnetic field incident to geothermal energy released from said sources produces electrostatic voltage gradients above the earth's surface having magnitudes in proportion to the magnitudes of the geothermal energy released, comprising sensing such electrostatic voltage gradients above the earth's surface during earth traversing movement; recording the magnitudes of said gradients; comparing the magnitudes of the gradients recorded; and determining the location of a geothermal energy source by designating the positions on the portions of the earth traversed having electrostatic voltage gradients of the greatest magnitude.

* * * * *